United States Patent [19]
Mercaldi et al.

[11] Patent Number: 5,976,990
[45] Date of Patent: Nov. 2, 1999

[54] METHOD FOR OPTIMIZATION OF THIN FILM DEPOSITION

[75] Inventors: Garry A. Mercaldi; Michael L. Nuttall, both of Meridian, Id.; Randhir P. S. Thankur, Cupertino, Calif.

[73] Assignee: Micron Technology, Inc., Boise, Id.

[21] Appl. No.: 09/004,931

[22] Filed: Jan. 9, 1998

[51] Int. Cl.$^6$ .......................... H01L 21/31; H01L 21/469
[52] U.S. Cl. .......................... 438/762; 438/785; 438/763
[58] Field of Search .................................... 438/762, 763, 438/785

[56] References Cited

U.S. PATENT DOCUMENTS

| | | |
|---|---|---|
| 5,212,119 | 5/1993 | Hah et al. |
| 5,434,110 | 7/1995 | Foster et al. |
| 5,665,640 | 9/1997 | Foster et al. |

Primary Examiner—John F. Niebling
Assistant Examiner—Josetta Jones

[57] ABSTRACT

An exemplary implementation of the present invention discloses a semiconductor fabrication method for forming a film in a reactor. Process conditions (temperature and pressure) are initially stabilized prior to a film deposition cycle. Once process conditions are stable, chemical elements of are nucleated onto a substrate surface to form a nucleation surface of the film. The bulk portion of the film is then deposited onto the nucleation surface. Finally, after the bulk of the film is deposited the surface of the film is conditioned. To tailor a film the process conditions are varied during the film deposition cycle wherein at least one of the pressures and temperatures is varied by at least 10%. In a specific implementation, a capacitor dielectric of silicon nitride is tailored by varying the pressure for the bulk film deposition and by varying both the temperature and pressure for the film surface formation phase.

26 Claims, 3 Drawing Sheets

METHOD FOR OPTIMIZATION OF THIN FILM DEPOSITION

FIELD OF THE INVENTION

This invention relates to semiconductor fabrication processing and more particularly to a method for Low Pressure Chemical Vapor Deposition (LPCVD) of films.

BACKGROUND OF THE INVENTION

State of the art Low Pressure Chemical Vapor Deposition (LPCVD) of thin films for front end processing applications, such as capacitor cell nitride, polysilicon, TEOS, etc., typically invoke the use of hot wall batch furnaces. Control of film selectivity, uniformity, stress and surface characteristics are critical to film performance.

Conventional LPCVD batch hot wall systems perform steady state deposition of thin films. That is, once film deposition is started, deposition takes place under constant conditions of temperature, pressure, and gas flows until film deposition is complete.

However, pressure and temperature play significant roles in a given chemical reaction and thus allow film deposition to occur in any one of the following quadrants. The first quadrant comprises deposition conditions of high pressure and low temperature. A main use of film deposition occurring in the first quadrant is that good nucleation of the deposited film will occur on diverse substrates.

The second quadrant comprises deposition conditions of low pressure and high temperature. A main use of film deposition occurring in the second quadrant is that generally mono-crystalline reactions, such as epitaxial, will occur on similar substrates.

The third quadrant comprises deposition conditions of high pressure and high temperature. A main use of film deposition occurring in the third quadrant is for causing single element forced reactions, such as high pressure oxidation.

The fourth quadrant comprises deposition conditions of low pressure and low temperature. A main use of film deposition occurring in the fourth quadrant is for depositing low deposition rate films or barrier films, where the film is sensitive to stress.

While each deposition quadrant causes specific film deposition to occur, the characteristics of the film, deposited within the confines of a given quadrant, is limited to characterization of that given quadrant as outlined above. For example, FIG. 1 depicts a typical deposition profile for silicon nitride. As shown in FIG. 1, a silicon nitride film is deposited while the deposition conditions remain constant throughout the entire film deposition cycle (i.e., deposition pressure and temperature are constant). The ranges of pressure and temperature will determine what deposition quadrant the resulting film is deposited in and thus establish the characteristics of the silicon nitride film. Typically for silicon nitride, deposition occurs in the first and fourth quadrants as explained above.

The present invention, however, develops an optimization method for using CVD to deposit films such that the films are tailored to obtain the desired film characteristics for a given application.

SUMMARY OF THE INVENTION

An exemplary implementation of the present invention discloses a semiconductor fabrication method for forming a film in a reactor. The reactor pressure and reactor temperature processing conditions in a film deposition reactor chamber are first stabilized prior to a film deposition cycle. Once film deposition conditions are stable, chemical elements are nucleated onto a substrate surface to form a nucleation surface of the film. The bulk of the film is then deposited onto the nucleation surface. Finally, after the bulk of the film is deposited the surface of the film is conditioned. To tailor a film the process conditions are varied during the film deposition cycle wherein at least one of the pressures and temperatures is varied in magnitude by at least 10% of initial temperature and pressure film deposition conditions.

DETAILED DESCRIPTION OF THE INVENTION

The present invention teaches a technique by which to vary the deposition conditions during critical deposition phases and thus create an optimal film. Three general phases that determine the characteristic of a deposited film are the nucleation phase, bulk deposition phase and surface formation phase.

Though the present invention provides a method to optimize many different kinds films, an exemplary implementation of the present invention is directed to a process for forming silicon nitride which may be used as a capacitor cell dielectric film. The silicon nitride dielectric is deposited using dichlorosilane and ammonia in an LPCVD hot wall reactor.

Figure 1:
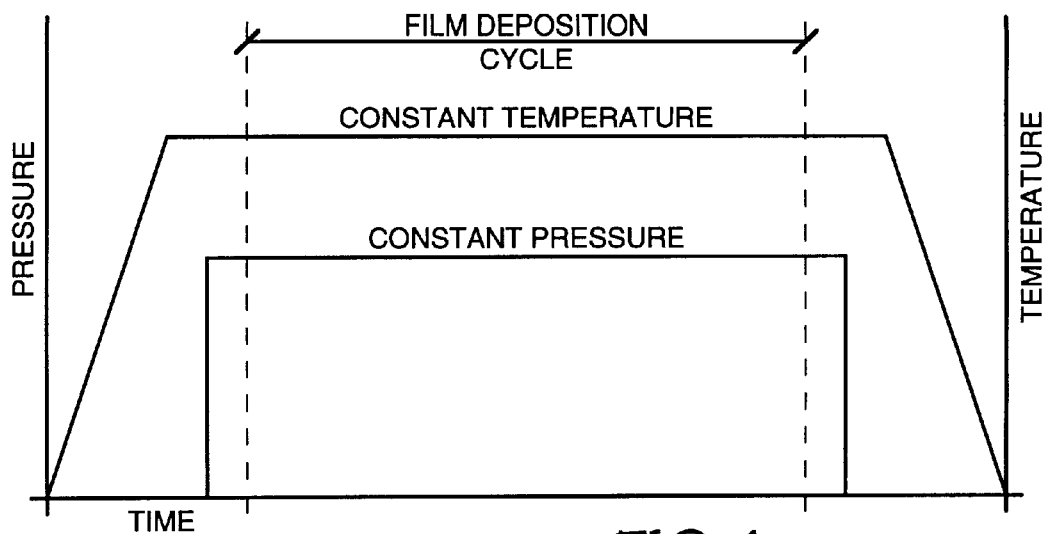
FIG. 1 depicts a typical deposition profile of a silicon nitride film with the deposition pressure and deposition temperature held constant.
Figure 2:
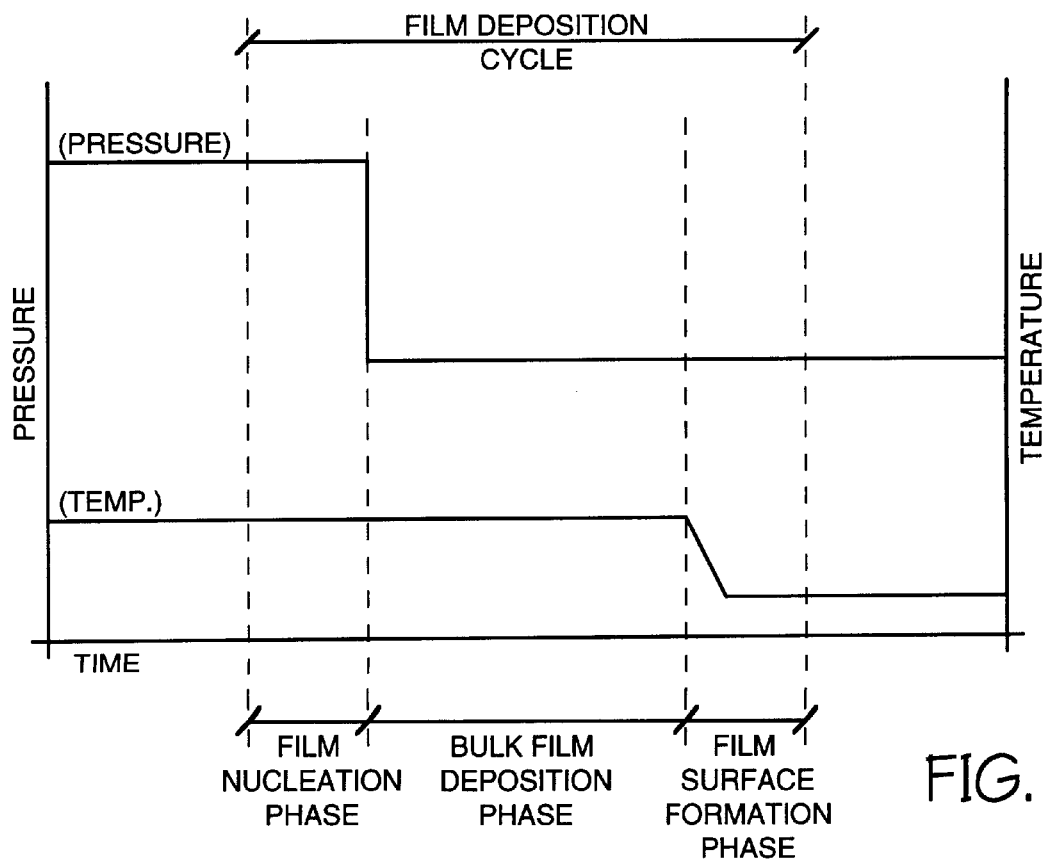
FIG. 2 depicts a deposition profile of the present invention showing three phases of film deposition being optimized by the varying of deposition conditions during at least one of the three phases.

FIG. 2 depicts how the first, second and third deposition phases are altered to create an optimum film. The first phase (or primary film deposition phase) is concerned with the nucleation phase of the film to be deposited, which includes the creation of initial film nucleation sites and the promotion of growth of the nucleation sites that eventually cluster together. During the first phase, the deposition pressure is varied in order to control the ability of the film to nucleate on different substrate materials (such as oxides and conductive materials), as well as to control the adhesion capability of the film to those materials.

On one hand, depositing silicon nitride, at low pressures, (i.e., less that 1 Torr) causes the silicon nitride to nucleate preferentially on polysilicon as opposed to oxide. On the other hand, high pressure deposition (i.e., 1 Torr or greater) will provide uniform nucleation distribution on both polysilicon and oxide. In the case of using silicon nitride as a capacitor cell dielectric, uniform nucleation distribution on both materials is important since the nitride also serves as a barrier to subsequent diffusion of impurity atoms. Therefore, nucleation of the silicon nitride is preferred at high pressure when being deposited as a cell dielectric film so that uniform nucleation distribution is achieved.

The second deposition phase (or secondary film deposition phase) is concerned with the bulk deposition phase of the film. During the secondary film deposition phase the bulk of the film (50–99% of the entire film) is deposited. For silicon nitride, low pressure is desired here to improve the overall film uniformity and control process variation by lowering the deposition rate.

The third deposition phase is the surface formation phase of the film. Silicon nitride leakage characteristics are affected by the surface roughness of the nitride film and this phase can tailor surface roughness to reduce leakage, improve the adhesion, or "condition" the nitride for subsequent top electrode deposition by changing the temperature during deposition. A lower deposition temperature results in a smoother film surface.

Figure 3A:
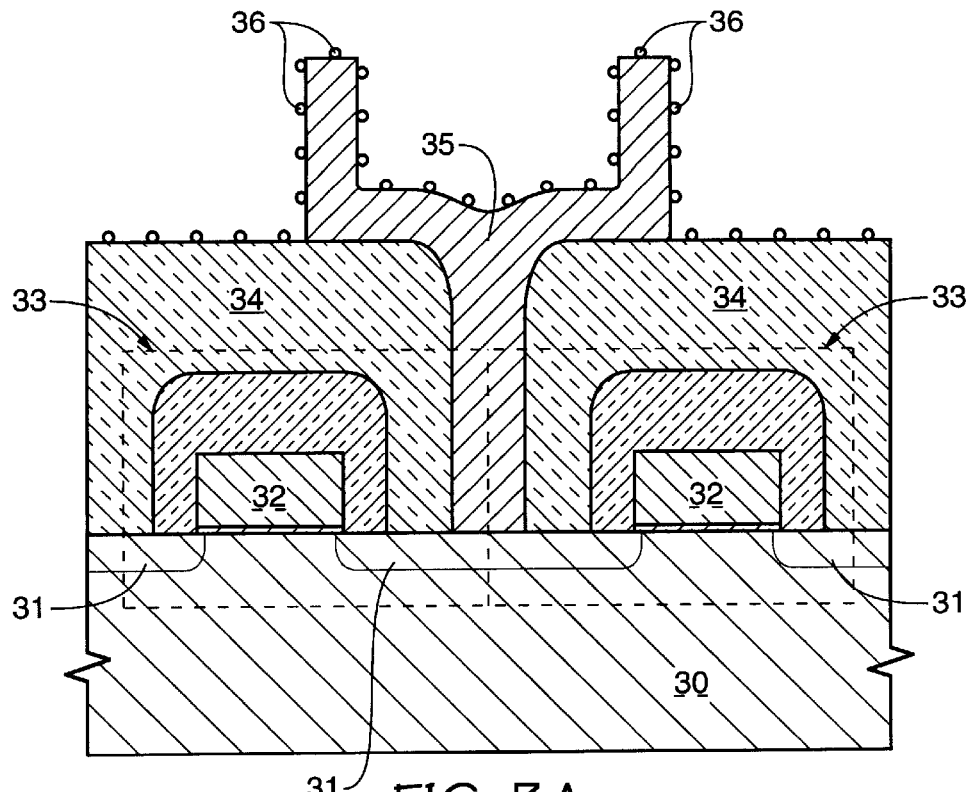
FIGS. 3A–3C are cross-sectional views of a semiconductor device portion depicting the formation of a capacitor on a supporting substrate wherein the capacitor cell dielectric is formed by the three phase deposition process of the present invention.
Figure 3B:
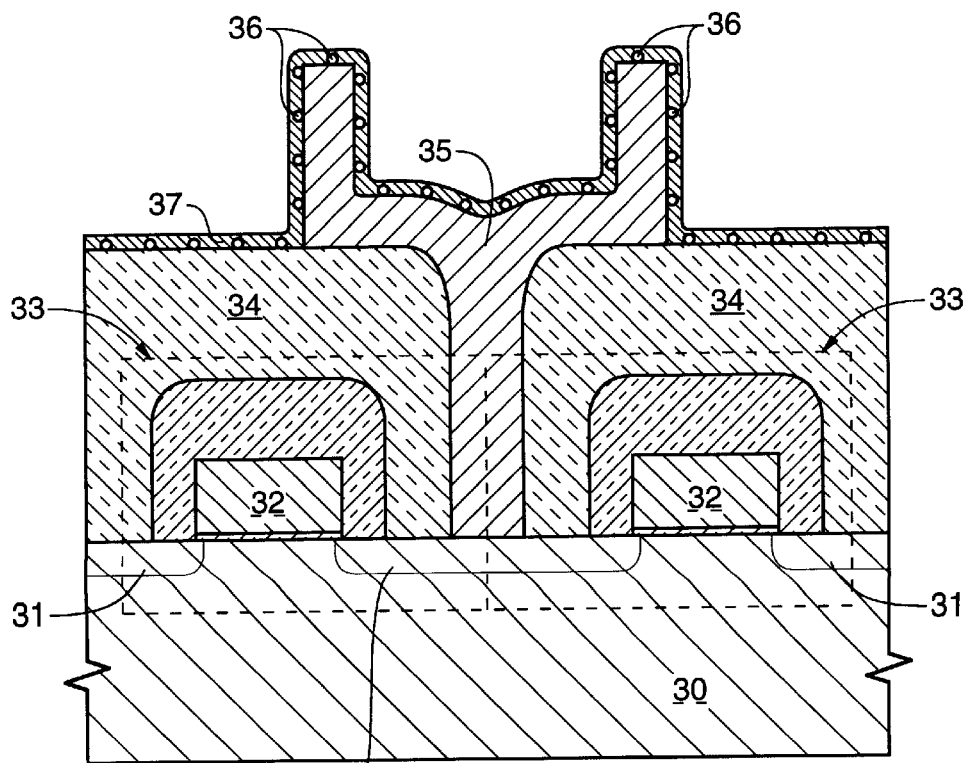
Figure 3C:
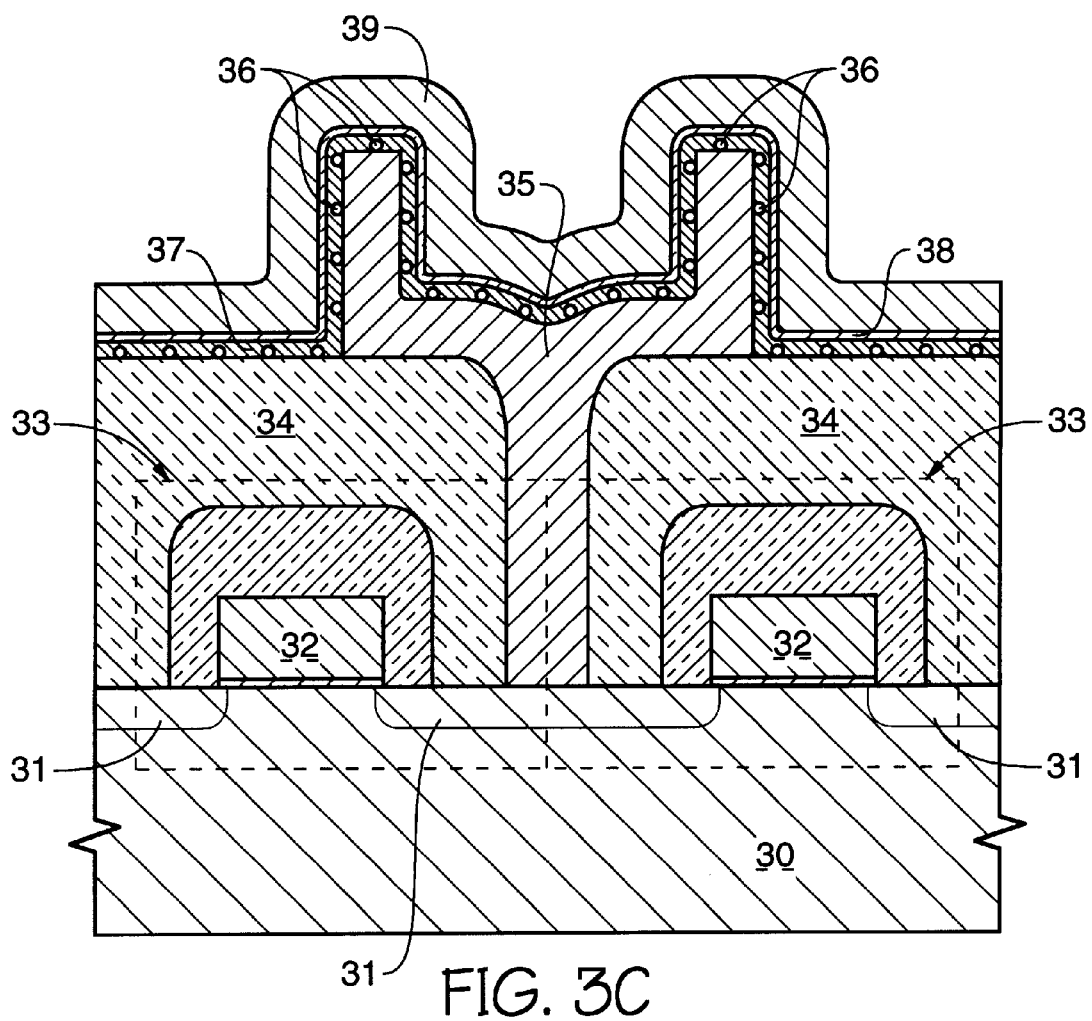

An exemplary implementation of the present invention, as may be applied to the formation of a dielectric film for a capacitor, is depicted in cross-sectional views of FIGS. 3A–3C, in direct reference to FIG. 2.

Referring now to FIG. 3A, on supporting substrate 30, active transistors 33, made up of conductively doped diffusion regions 31 and transistor gates 32 have been formed. A first capacitor electrode 35 is provided that extends through a supporting material 34 and makes contact to diffusion region 31. The semiconductor assembly is now presented to a deposition reactor for capacitor cell dielectric formation. In light of the present invention, as depicted in FIG. 2, first capacitor electrode 35 is subjected to the film nucleation phase. During the film nucleation phase, the deposition pressure will control the ability of the film to nucleate on different substrate materials, as well as to control the adhesion capability of the film to those materials. Assuming the first capacitor electrode 35 comprises a polysilicon surface and the supporting material 34 is silicon oxide, uniform nucleation sites and crystallization growth clusters of a silicon nitride film is desired on both the polysilicon electrode 35 and silicon oxide 34. By controlling the nucleation phase of the nitride film in such a manner as to cause uniform nucleation distribution on both the polysilicon electrode 35 and the silicon oxide supporting material 34 creates a big advantage. The formation of a silicon nitride film that is uniform in thickness on the silicon oxide supporting material 34 will now sufficiently serve as a barrier to subsequent diffusion of impurity atoms. Typically oxygen atoms will diffuse through silicon oxide 34 and oxidize the underlying silicon portions containing conductively doped diffusion regions 31 of the underlying transistors 33 if a barrier layer is not in place. Obviously, the oxidation of the silicon will adversely effects the active transistor's electrical characteristics. Therefore, to cause uniform distribution film nucleation to occur on both the polysilicon material 35 and silicon oxide 34, nucleation of the silicon nitride is performed at high pressure. The resulting film nucleation distribution is represented by nucleation sites 36.

Referring now to FIG. 3B, film formation continues by entering the bulk deposition phase of the film by the formation of secondary nucleation to form a continuous silicon nitride film (if the film has not already reached the continuous stage during the nucleation phase). For silicon nitride, low pressure is desired here to improve the overall film uniformity, reduce film stress and control process variation by lowering the deposition rate. Bulk deposition occurs as secondary nuclei form on the initial film nucleation increase the thickness of the silicon nitride film (approximately 50–99% of the overall film thickness) represented by nitride bulk film 37.

Referring now to FIG. 3C, film formation continues by entering the surface formation phase of the film. Silicon nitride leakage characteristics are affected by the surface roughness of the film and this phase can be tailored to reduce leakage, improve the adhesion, or "condition" the nitride film prior to a subsequent top electrode deposition by changing the temperature during the nitride film deposition. The final surface of the silicon nitride film is represented by conditioned film surface 38. Finally, once the nitride film is tailored by the surface formation phase, a second capacitor electrode 39 is formed on nitride film surface 38.

In the exemplary implementation set forth above and as depicted in FIG. 2, a optimum silicon nitride film of approximately 60Å in thickness (such as a film for use as a capacitor cell dielectric), was formed by the following parameter settings for each film deposition phase. Prior to the film deposition cycle the reactor chamber process parameters of temperature and pressure are stabilized at approximately 645° C. (+/−2° C.) and at approximately 1.55 Torr (+/−0.5 Torr). During the film nucleation phase, the temperature remains at approximately 645° C. and the pressure remains at approximately 1.55 Torr. During bulk film deposition phase the temperature remains at approximately 645° C. and the pressure is set to approximately 500 m Torr. During the film surface formation phase the temperature is reduced to approximately 620° C. and the pressure remains at approximately 500 m Torr. This example shows that during the film deposition cycle, the temperature changed by at least 5° C. and the pressure changed by at least 10%. This example also demonstrates that by using the method of the present invention, a film may be tailored by changing at least one of the process parameters (either the magnitude of temperature and/or pressure) to a stabilized process condition that is outside the magnitude of the initial stabilized pre-film deposition parameters (the temperature is normalized in degrees Celsius and the pressure is normalized in Torr). The process parameter that is changed for a selected film deposition phase must also become stabilized during that phase to +/−2° C. and/or +/−0.5 Torr.

As shown in FIG. 2, changing process parameters during the film deposition cycle (for any one of the three film formation phases) to develop the optimum film for a given use, is the key to the present invention. FIG. 2 also demonstrates that pressure in a reactor can be changed almost instantaneously. However, changing the reactor's deposition temperature will require a ramp down time period (or ramp up time period, whichever is the case) for the desired temperature to stabilize. Also, as seen in FIG. 2, the deposition temperature is reduced after the bulk film deposition phase as the process enters the film surface formation phase and thus requires a temperature ramp down time period. The ramp down time period will depend on the type of reactor being used. In a conventional reaction furnace (i.e. a batch reactor) the ramp down period will be longer then the ramp down time period required in a rapid thermal processing unit (i.e. a fast ramp reactor). Therefore, depending on the reactor used and necessary processing conditions needed to deposit a given film type, it may be necessary to turn off at least one reactive gas to the reactor for a period of time until the desired process conditions are reached. If a single wafer system having multiple chambers is used, then each chamber could be set to and be maintained at the desired process conditions and as the wafer passes from one chamber to the next, the deposition gases would need to be turned off until the wafer is safely confined in the next chamber. In this way, as the wafer passes from one chamber to the next, the three phases of film deposition can be controlled in separate chambers to accomplish the desired results for a given film.

Additionally, before the film deposition cycle begins, the deposition temperature and deposition pressure must become stable inside a reaction chamber to within a 2° C. variance of the desired temperature and the pressure (which is more instantaneous) inside said reaction chamber must be stable to within a 5% pressure variance of the desired pressure. After the temperature and pressures are stable, initial film nucleation may begin by introducing the required reactant deposition gas or gases into the reaction chamber. When the film deposition cycle is ready to enter a subsequent phase (i.e., bulk film deposition phase or surface formation phase) the temperature is varied by at least 5° C. or the pressure is varied by at least 10% from the initial stabilized deposition temperature and pressure to obtain the desired film characteristics. In fact, depending on the film being deposited and as shown in FIG. 2, both temperature and pressure variations may be required.

From the above exemplary implementations of the present invention the advantages of the above process become apparent as a film with better selectivity, uniformity, stress, electrical properties and adhesion quality can be produced by optimizing the conditions for film deposition during each deposition phase. Also, the present invention may be used to tailor other thin films formed by LPCVD, such as barium strontium titanate (BST), tantalum oxide ($Ta_2O_5$), titanium nitride (TiN), boron nitride, polysilicon, silicon-germanium (Si—Ge).

It is to be understood that although the present invention has been described with reference to several preferred embodiments, various modifications, known to those skilled in the art, may be made to the structures and process steps presented herein without departing from the invention as recited in the claims appended hereto.

What is claimed is:

1. A semiconductor fabrication method for forming a film, said method comprising:

stabilizing the magnitude of reactor pressure and reactor temperature processing parameters in a film deposition reactor chamber prior to a film deposition cycle, said reactor temperature normalized on the degrees Celsius scale and said reactor pressure normalized on the Torr scale;

nucleating chemical elements from a chemical vapor onto a substrate surface to form a nucleation surface comprising chemical elements of said film;

depositing a bulk layer of said film onto said nucleation surface;

conditioning the surface of said film;

wherein during said film deposition cycle at least one of said processing parameters is changed in magnitude which is outside of the corresponding stabilized processing parameter magnitude.

2. The method of claim 1, wherein said stabilizing reactor pressure and reactor temperature comprises maintaining a temperature inside said reactor to within a 2° C. variance and maintaining a pressure inside said reactor to within a 5% pressure variance.

3. The method of claim 1, wherein said film consists essentially of a material selected from barium strontium titanate (BST), tantalum oxide ($Ta_2O_5$), titanium nitride (TiN), and boron nitride.

4. The method of claim 1, wherein said film consists essentially of a material selected from polysilicon and silicon-germanium (Si—Ge).

5. The method of claim 1, wherein said method is performed in a batch reactor.

6. The method of claim 5, wherein said batch reactor comprises a fast ramp reactor.

7. The method of claim 1, wherein said method is performed in a single wafer reactor.

8. A semiconductor fabrication method for forming a film by chemical vapor deposition, said method comprising:

stabilizing a first temperature in a reaction chamber to within a 2° C. variance;

stabilizing a first pressure in said reaction chamber to within a 5% pressure variance;

depositing primary film on a substrate material by introducing at least one reactant deposition gas into said reaction chamber;

depositing secondary film on said primary film during a second temperature and a second pressure of said reaction chamber;

controlling surface formation of said film during a third temperature and a third pressure of said reaction chamber;

wherein at least one of said second and third temperatures is varied in magnitude by at least 5° C. of said first temperature.

9. The method of claim 8, wherein the flow of said at least one reactant deposition gas is restrained until said at least one of said second and third temperatures that is varied by at least 5° C. becomes stabilized within a 2° C. variance.

10. A semiconductor fabrication method for forming a film by chemical vapor deposition, said method comprising:

stabilizing a first temperature in a reaction chamber to within a 2° C. variance;

stabilizing a first pressure in said reaction chamber to within a 5% pressure variance;

depositing primary film on a substrate material by introducing at least one reactant deposition gas into said reaction chamber;

depositing secondary film on said primary film during a second temperature and a second pressure of said reaction chamber;

controlling surface formation of said film during a third temperature and a third pressure of said reaction chamber;

wherein at least one of said second and third pressures is varied in magnitude by at least 10% of said first pressure.

11. The method of claim 10, wherein the flow of said at least one reactant deposition gas is restrained until said at least one of said second and third temperatures that is varied in magnitude by at least 5° C. becomes stabilized within a 2° C. variance.

12. A semiconductor fabrication method for forming a film by chemical vapor deposition, said method comprising:

stabilizing a first temperature in a reaction chamber to within a 2° C. variance;

stabilizing a first pressure in said reaction chamber to within a 5% pressure variance;

depositing primary film on a substrate material by introducing at least one reactant deposition gas into said reaction chamber;

depositing secondary film on said primary film during a second temperature and a second pressure inside of said reaction chamber;

controlling surface formation of said film during a third temperature and a third pressure of said reaction chamber;

wherein at least one of said second and third temperatures is varied in magnitude by at least 5° C. of said first temperature and at least one of said pressures is varied in magnitude by at least 10% of said first pressure.

13. The method of claim 12, wherein the flow of said at least one reactant deposition gas is restrained until said at least one of said second and third temperatures that is varied in magnitude by at least 5° C. becomes stabilized within a 2° C. variance.

14. A semiconductor fabrication method for forming a film by chemical vapor deposition in a multiple reaction chamber system, said method comprising:

stabilizing a first temperature in a first reaction chamber to within a 2° C. variance;

stabilizing a first pressure in said first reaction chamber to within a 5% pressure variance;

depositing primary film on a semiconductor assembly by introducing reactant deposition gases into said first reaction chamber;

transferring said semiconductor assembly to a second reaction chamber and depositing secondary film on said film during a second temperature and a second pressure while in said second reaction chamber;

transferring said semiconductor assembly to a third reaction chamber and controlling surface formation of said film during a third temperature and a third pressure while in said reaction chamber.

15. The method of claim 14, wherein at least one of said second and third temperatures is varied in magnitude by at least 5° C. of said first temperature.

16. The method of claim 14, wherein at least one of said second and third pressures is varied in magnitude by at least 10% of said first pressure.

17. The method of claim 14, wherein at least one of said second and third temperatures is varied in magnitude by at least 5° C. of said first temperature and at least one of said pressures is varied in magnitude by at least 10% of said first pressure.

18. The method of claim 14, wherein the flow of said reactant gas is restrained until said transferring of said wafer to said reaction chambers is complete.

19. A process for forming a capacitor cell dielectric film in a deposition chamber for a semiconductor device, said process comprising:

stabilizing a first temperature in a reaction chamber to within a 2° C. variance;

stabilizing a first pressure in said reaction chamber to within a 5% pressure variance;

depositing silicon nitride film nuclei on a substrate material by introducing silicon and nitrogen gas vapors into said reaction chamber;

depositing secondary silicon nitride film nuclei on said silicon nitride film nuclei to form a bulk portion of said silicon nitride film on said substrate material during a second temperature and a second pressure inside said reaction chamber;

controlling surface formation of said silicon nitride film during a third temperature and a third pressure inside said reaction chamber;

wherein said second and third pressures are at least 10% less than said first pressure and said third temperature is at least 5° C. less than said first temperature.

20. The method of claim 19, wherein said substrate material comprises an insulating material adjacent a conductive material.

21. The method of claim 20, wherein said insulating material comprises an oxide material.

22. The method of claim 20, wherein said conductive material comprises a semiconductive material.

23. The method of claim 22, wherein said semiconductive material comprises a silicon material.

24. A process for forming a storage capacitor in a deposition chamber for a semiconductor device, said process comprising:

forming a first conductive capacitor electrode;

stabilizing a first temperature in a reaction chamber to within a 2° C. variance;

stabilizing a first pressure in said reaction chamber to within a 5% pressure variance;

depositing silicon nitride film nuclei on a said conductive capacitor electrode and an oxide material by disposing silicon and nitrogen gas vapors into said reaction chamber;

depositing secondary silicon nitride film nuclei on said silicon nitride film nuclei to form a bulk portion of a silicon nitride film on said substrate material during a second temperature and a second pressure inside said reaction chamber;

controlling surface formation of said silicon nitride film during a third temperature and a third pressure inside said reaction chamber;

depositing a second capacitor electrode on said silicon nitride film;

wherein said second and third pressures are at least 10% less than said first pressure and said third temperature is at least 5° C. less than said first temperature.

25. The method of claim 24, wherein said conductive capacitor electrode comprises a semiconductive material.

26. The method of claim 25, wherein said semiconductive material comprises a silicon material.

* * * * *